(12) United States Patent
Muthers

(10) Patent No.: US 9,024,795 B2
(45) Date of Patent: May 5, 2015

(54) CONTINUOUS-TIME DELTA SIGMA MODULATOR

(71) Applicant: Micronas GmbH, Freiburg (DE)

(72) Inventor: David Muthers, Denzlingen (DE)

(73) Assignee: Micronas GmbH, Freiburg (DE)

(*) Notice: Subject to any disclaimer, the term of this patent is extended or adjusted under 35 U.S.C. 154(b) by 0 days.

(21) Appl. No.: 14/260,899

(22) Filed: Apr. 24, 2014

(65) Prior Publication Data

US 2014/0320325 A1    Oct. 30, 2014

(30) Foreign Application Priority Data

Apr. 24, 2013 (DE) .......................... 10 2013 007 030

(51) Int. Cl.
*H03M 3/00* (2006.01)

(52) U.S. Cl.
CPC ................ *H03M 3/30* (2013.01); *H03M 3/322* (2013.01); *H03M 3/458* (2013.01)

(58) Field of Classification Search
CPC ............................................. H03M 3/30–3/50
USPC .......................... 341/118–121, 143, 155, 166
See application file for complete search history.

(56) References Cited

U.S. PATENT DOCUMENTS

| | | | |
|---|---|---|---|
| 7,324,028 B2 * | 1/2008 | Hsieh et al. .................. 341/120 |
| 7,397,291 B1 * | 7/2008 | Parkes et al. .................. 327/176 |
| 7,944,385 B2 * | 5/2011 | Le Guillou .................... 341/143 |
| 8,077,066 B2 | 12/2011 | Niwa et al. | |
| 8,643,518 B2 * | 2/2014 | da Silva et al. ............... 341/120 |
| 8,749,414 B2 * | 6/2014 | Cho et al. ...................... 341/120 |
| 2005/0285763 A1 | 12/2005 | Nguyen et al. | |

FOREIGN PATENT DOCUMENTS

| | | |
|---|---|---|
| DE | 10 2008 020 452 A1 | 11/2008 |
| JP | 63-267017 A | 11/1988 |
| JP | 05-75468 A | 3/1993 |
| JP | 2010-263483 A | 11/2010 |

OTHER PUBLICATIONS

A 20-mW 640-MHz CMOS Continuous-Time $\Sigma\Delta$ ADC with 20-MHz Signal Bandwidth, 80-dB Dynamic Range and 12-bit ENOB, Mitteregger et al., IEEE Journal of Solid-State Circuits, vol. 41. No. 12, Dec. 2006.

* cited by examiner

Primary Examiner — Brian Young
(74) Attorney, Agent, or Firm — Muncy, Geissler, Olds & Lowe, P.C.

(57) ABSTRACT

A continuous-time delta sigma modulator, having an integrator and a comparator clocked with a clock frequency that are connected in a feedback loop, having a voltage source that is connected to the comparator for applying a threshold voltage to the comparator, in which an integration time constant of the integrator has a first resistor and a first capacitor, in which the voltage source has a second resistor and a second capacitor for setting the threshold voltage, in which the first resistor and the second resistor are part of a resistor pairing structure, and in which the first capacitor and the second capacitor are part of a capacitor pairing structure.

8 Claims, 2 Drawing Sheets

CONTINUOUS-TIME DELTA SIGMA MODULATOR

This nonprovisional application claims priority under 35 U.S.C. §119(a) to German Patent Application No. 10 2013 007 030.9, which was filed in Germany on Apr. 24, 2013, and which is herein incorporated by reference.

BACKGROUND OF THE INVENTION

1. Field of the Invention

The present invention relates to a continuous-time delta sigma modulator.

2. Description of the Background Art

A continuous-time delta sigma analog-to-digital converter is known from "A 20-mW 640-MHz CMOS Continuous-Time ΣΔ ADC with 20-MHz Signal Bandwidth, 80-dB Dynamic Range and 12-bit ENOB," Mitteregger et al., IEEE JOURNAL OF SOLID-STATE CIRCUITS, Vol. 41, No. 12, December 2006. To eliminate influences on the loop stability, the loop capacitors are trimmed, either statically or in operation. To this end, the appropriate discrete capacitor value must be ascertained. In contrast to a static trimming, only a dynamic trimming of a non-active modulator can eliminate temperature influences on resistors and clock frequency ($f_{clk}$). A dynamic trimming of an active modulator can briefly result in converter errors.

In DE 10 2008 020 452 A1, which corresponds to U.S. Pat. No. 7,893,518, assembled semiconductor components are produced in an array of identical (semiconductor) elements that are arranged on a wafer distributed about a common focus in order to compensate for possible gradients of inhomogeneities of process parameters (layer thicknesses, doping, etc.) that result from process tolerances along the surface. The individual elements are relatively large in size.

SUMMARY OF THE INVENTION

It is therefore an object of the invention to improve a continuous-time delta sigma modulator—in particular as part of an analog-to-digital converter—to the greatest degree possible.

Accordingly, a continuous-time delta sigma modulator is provided.

The continuous-time delta sigma modulator has an integrator and a comparator clocked with a clock frequency by means of a clock signal. The integrator and the comparator are connected in a feedback loop.

The continuous-time delta sigma modulator has a voltage source. The voltage source is connected to the comparator for applying a threshold voltage to the comparator.

An integration time constant of the integrator has a first resistor and a first capacitor.

The voltage source has a second resistor and a second capacitor for setting the threshold voltage.

The first resistor and the second resistor are part of a resistor pairing structure.

The first capacitor and the second capacitor are part of a capacitor pairing structure.

Investigations by the applicant have shown that the resistor pairing structure can be achieved on a semiconductor chip by the means that the first resistor and the second resistor are produced by the same process steps. Preferably, the first resistor and the second resistor are arranged on the semiconductor chip adjacent to one another and electrically isolated. In addition, the capacitor pairing structure can be achieved on the semiconductor chip by the means that the first capacitor and the second capacitor are produced by the same process steps. Preferably, the first capacitor and the second capacitor are arranged on the semiconductor chip adjacent to one another and electrically isolated. A stability of the loop gain of the continuous-time delta sigma modulator is achieved for a large region of the clock frequency. Furthermore, there is no requirement for a measurement process and the associated dimensioning of a control loop. The threshold voltage is not regulated by the voltage source, but instead is controlled by it, which permits very rapid adjustment of the threshold voltage. Effects of temperature changes and of manufacturing-related deviations are substantially reduced.

According to an embodiment, provision is made for the comparator to be designed to change a loop gain of the feedback loop by means of the threshold voltage.

In an embodiment, the voltage source is designed to produce the threshold voltage from the input quantities of a reference voltage and a period of the clock frequency and from a time constant. The time constant is based on the second resistor and the second capacitor.

According to an embodiment, the threshold voltage present at the comparator has an inverse proportional dependence on the product of the first resistor and the first capacitor and the clock frequency.

In an embodiment, the voltage source has semiconductor switches for controlling a discharging of the second capacitor and for controlling a charging of the second capacitor through the second resistor for the duration of a period of the clock frequency.

The improvement variants described above are especially advantageous both individually and in combination. All improvement variants can be combined with one another. Some possible combinations are explained in the description of the exemplary embodiments from the drawings. However, these possibilities of combinations of the improvement variants shown in the figures are not exhaustive.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

In continuous-time delta sigma modulators, the loop gain is influenced by the integration time constant RC. The quality of the so-called noise shaping and the stability of the modulator depend on the ratio of the crossover frequency of the loop gain to the clock frequency $f_{clk}$. The integration time constant RC and the clock frequency $f_{clk}$ can vary as a result of manufacturing variations and temperature effects.

The goal is thus to track comparator thresholds in order to continuously stabilize this ratio during normal operation of the modulator.

Figure 1:
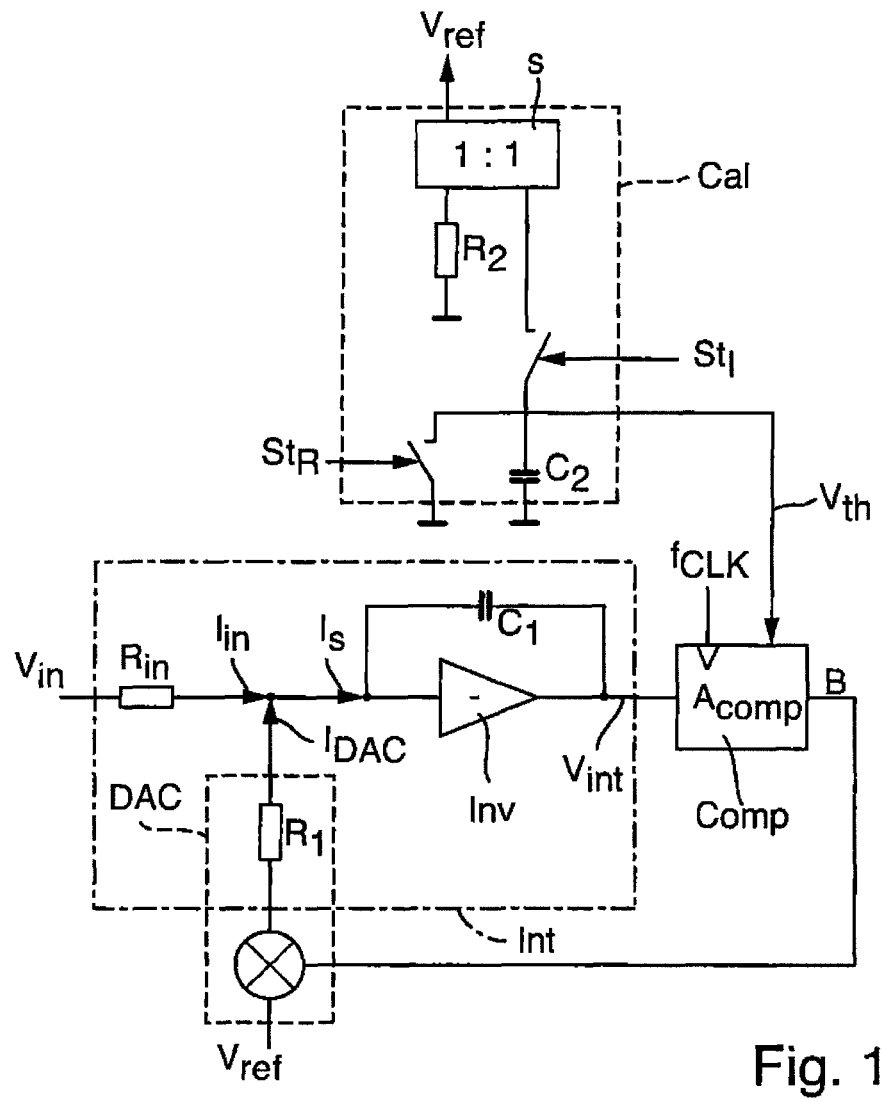
FIG. 1 is a schematic circuit diagram of a continuous-time delta sigma modulator.

FIG. 1 shows a simplified model of a first-order continuous-time delta sigma modulator. The continuous-time delta sigma modulator has an integrator Int and a comparator Comp and a digital-to-analog converter DAC in the feedback path. An input voltage $V_{in}$ is converted into an input current $I_{in}$ by means of an input resistor $R_{in}$. The digital-to-analog converter DAC in the exemplary embodiment of FIG. 1 likewise has a resistor $R_1$ through which the output current $I_{DAC}$ of the digital-to-analog converter DAC flows. The two currents $I_{in}$ and $I_{DAC}$ are summed to produce the total current $I_S$, and the total current $I_S$ is converted into the voltage $V_{int}$ by the inverting amplifier Inv with feedback through a first capacitor $C_1$. The integrator Int thus performs a low-pass filtering.

The loop stability for the first-order continuous-time delta sigma modulator from FIG. 1 is explained in the following. The input voltage $V_{in}$ is not important when examining loop stability. Higher-order modulator loops can be approximated by a first order loop for frequencies around the crossover frequency, which are critical when examining loop stability. For this reason, the following examination also applies in corresponding fashion to higher-order loops.

In accordance with the exemplary embodiment in FIG. 1, an application for multi-bit systems is provided. In the exemplary embodiment in FIG. 1, the comparator Comp has more than two output values, so that a gain $A_{comp}$ can be associated with the comparator Comp. The gain $A_{comp}$ is shown schematically in FIG. 3. The comparator Comp in this case has two nonzero thresholds.

The loop gain of the feedback loop in FIG. 1 is:

$$A_0(j\omega) = \frac{1}{j\omega R_1 C_1} A_{comp} V_{ref}$$

Figure 3:
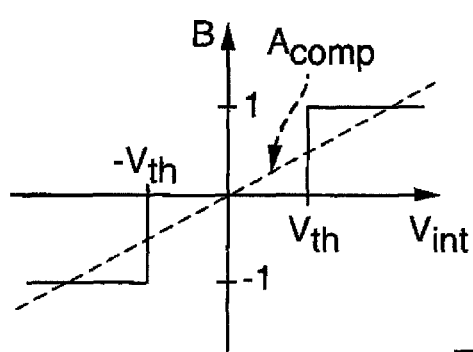
FIG. 3 is a schematic diagram of a transfer function.

The loop gain $A_0(j\omega)$ is dimensionless here. The gain $A_{comp}$ has the unit 1/volt; j is an imaginary number, $\omega$ is the angular frequency, $R_1$ is the first resistor, $C_1$ is the first capacitor, and $V_{ref}$ is a reference voltage. As is shown in FIG. 3, the gain $A_{comp}$ is the ratio of a dimensionless digital value to the input voltage of the comparator Comp.

The delay of the comparator $\Delta T_{comp}$, which is $\alpha T_{clk}$ in clocked systems, results in an additional phase shift in the feedback loop according to:

$$\Delta \varphi_{comp} = 2\pi \Delta T_{comp} f_{T,A0} = 2\pi \frac{\alpha}{f_{clk}} f_{T,A0}$$

Here, $f_{T,A0}$ is the crossover frequency of the loop gain $A_0(j\omega)$. For adequate stability, the phase shift may be a maximum of 180°. A constant $\Delta \varphi_{comp}$ results in a constant phase margin, and thus consistent stability. Here, the following holds for the ratio:

$$\frac{f_{T,A0}}{f_{clk}} = f'_{T,A0} = \text{constant}$$

The crossover frequency $f_{T,A0}$ of the loop gain can be determined from:

$$\left| \frac{A_{comp} V_{ref}}{j 2\pi f_{T,A0} R_1 C_1} \right| = 1$$

$$\rightarrow f_{T,A0} = \frac{A_{comp} V_{ref}}{2\pi R_1 C_1}$$

The normalized crossover frequency $f_{T,A0}'$ is then:

$$f'_{T,A0} = \frac{A_{comp} V_{ref}}{2\pi R_1 C_1 f_{clk}} = \text{constant}$$

Thus, the following applies for the approximated, linearized gain $A_{comp}$ of the comparator Comp in FIG. 1:

$$A_{comp} \sim R_1 C_1 f_{clk}/V_{ref}$$

The comparator Comp from FIG. 1 has a transfer function that is shown schematically in FIG. 3. The output signal is −1 for an input voltage less than $-V_{th}$. The output signal is 0 for an input voltage between $-V_{th}$ and $V_{th}$. The output signal is 1 for an input voltage greater than $V_{th}$. The output signal of the comparator Comp is thus a ternary signal. As an alternative to the exemplary embodiment from FIG. 1, comparators with more than three output states can be used, for example with five or seven output states.

The linearized gain $A_{comp}$ of this three-state comparator Comp from FIG. 1 is shown schematically in FIG. 3 and can be defined with:

$$\rightarrow A_{comp} \approx 1/(2V_{th})$$

using equation (7), the threshold voltage $V_{th}$ is:

$$\rightarrow V_{th} \sim V_{ref}/(R_1 C_1 f_{clk})$$

Thus, if the comparator thresholds $V_{th}$ have an inversely proportional dependence on the product of $R_1$, $C_1$, and $f_{clk}$, and are proportional to the reference voltage $V_{ref}$, then the dependence of the loop stability on these three parameters is eliminated.

FIG. 1 schematically shows one possible implementation of a voltage source Cal for producing the threshold voltage $V_{th}$. In this design, the charge of a capacitor $C_2$ is periodically extinguished and is recharged with a current $I_{ref}$ that is proportional to $1/R_2$ for the duration $T_{clk}$ of one period of the clock frequency $f_{clk}$. To generate the current $I_{ref}$, for example, the resistor $R_2$ and a current mirror S with a mirror ratio of 1:1 are connected to the voltage $V_{ref}$. By means of the control signal $St_I$, an associated switch is closed and the capacitor $C_2$ is charged with the current $I_{ref}$ for the time period $T_{clk}$. By means of the control signal $ST_R$, an associated switch is closed and the capacitor $C_2$ is discharged.

The voltage $V_{th}$ then results from:

$$V_{th} = \int_{T_{clk}} \frac{I_{ref}}{C_2} dt = \frac{V_{ref}}{R_2 C_2 f_{clk}}$$

Figure 2:
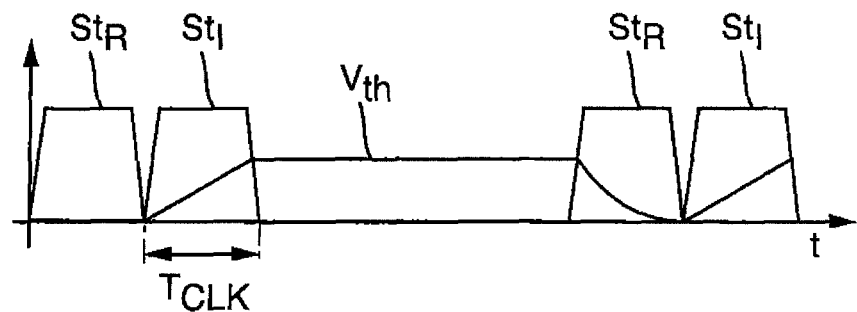
FIG. 2 is a schematic diagram of control signals.

FIG. 2 shows the diagram of the voltage source Cal with the control signals $St_I$, $St_R$ from FIG. 1. In this exemplary embodiment, the dependency of the loop stability on the parameters is eliminated by the means that the following proportionality relationship applies:

$$R_1 C_1 \sim R_2 C_2$$

In the simplest case, $R_1=R_2=R$ and $C_1=C_2=C$. Naturally, other ratios are also possible. The clock frequency can also be altered, for example by division or by doubling, in order to satisfy the condition of equation (10). It is likewise possible to use two different reference voltages, for example $V_{ref}$ and $V_{ref}/2$. The resistors $R_1$ and $R_2$ are implemented as a pairing structure. The capacitors $C_1$ and $C_2$ are likewise implemented as a pairing structure. It is likewise possible to use a matching structure with nested resistor elements as the resistor pairing structure for especially high precision. It is likewise possible to use a matching structure with nested capacitor elements as the capacitor pairing structure for especially high precision.

The continuous-time delta sigma analog-to-digital converter of the exemplary embodiment in FIG. 1 is advantageously integrated into a semiconductor chip together with a sensor, in particular a Hall sensor. In a circuit designed by the applicant, changes in the frequency $f_{clk}$ from ½ of the nominal value to 3 times the nominal value do not affect the converter performance. The continuous-time delta sigma analog-to-digital converter of the exemplary embodiment in FIG. 1 is very robust with regard to absolute value variations.

The invention is not limited to the variant embodiments shown in FIGS. 1 to 3. For example, it is possible to specify a different circuit for generating the threshold voltage $V_{th}$ that has a corresponding dependency on $T_{clk}$, $R_2$, $C_2$ and $V_{ref}$. If a comparator with, e.g., three positive and three negative thresholds is used, the threshold voltages $V_{th}$, $2V_{th}$, and $3V_{th}$ are produced by multiple identical second capacitors connected in series that are charged together by the current $I_{ref}$ and are discharged simultaneously, for example. It is also possible to provide a higher order continuous-time delta sigma modulator, wherein all resistors and capacitors correspondingly satisfy the proportionality condition.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A continuous-time delta sigma modulator comprising:
   an integrator and a comparator clocked with a clock frequency that are connected in a feedback loop; and
   a voltage source that is connected to the comparator and outputs a threshold voltage to the comparator,
   wherein the comparator output different values based on a difference between an input voltage received from the integrator and the threshold value received from the comparator,
   wherein an integration time constant of the integrator has a first resistor and a first capacitor,
   wherein the voltage source has a second resistor and a second capacitor for setting the threshold voltage,
   wherein the first resistor and the second resistor are part of a resistor pairing structure, and
   wherein the first capacitor and the second capacitor are part of a capacitor pairing structure.

2. The continuous-time delta sigma modulator according to claim 1, wherein the comparator is configured to change a loop gain of the feedback loop via the threshold voltage.

3. The continuous-time delta sigma modulator according to claim 1, wherein the voltage source is configured to produce the threshold voltage from the input quantities of a reference voltage and a period of the clock frequency and from a time constant, and wherein the time constant is based on the second resistor and the second capacitor.

4. The continuous-time delta sigma modulator according to claim 1, wherein the threshold voltage has an inverse proportional dependence on the product of the first resistor and the first capacitor and the clock frequency.

5. The continuous-time delta sigma modulator according to claim 1, wherein the voltage source has semiconductor switches for controlling a discharging of the second capacitor and for controlling a charging of the second capacitor through the second resistor for the duration of one period of the clock frequency.

6. The continuous-time delta sigma modulator according to claim 1, wherein the feedback loop has additional integrators to form a delta sigma modulator of an order higher than one.

7. A continuous-time delta sigma modulator comprising:
   an integrator and a comparator clocked with a clock frequency that are connected in a feedback loop; and
   a voltage source that is connected to the comparator for applying a threshold voltage to the comparator,
   wherein an integration time constant of the integrator has a first resistor and a first capacitor,
   wherein the voltage source has a second resistor and a second capacitor for setting the threshold voltage,
   wherein the first resistor and the second resistor are part of a resistor pairing structure,
   wherein the first capacitor and the second capacitor are part of a capacitor pairing structure, and
   wherein the comparator is configured to change a loop gain of the feedback loop via the threshold voltage.

8. A continuous-time delta sigma modulator comprising:
   an integrator and a comparator clocked with a clock frequency that are connected in a feedback loop; and
   a voltage source that is connected to the comparator for applying a threshold voltage to the comparator,
   wherein an integration time constant of the integrator has a first resistor and a first capacitor,
   wherein the voltage source has a second resistor and a second capacitor for setting the threshold voltage,
   wherein the first resistor and the second resistor are part of a resistor pairing structure,
   wherein the first capacitor and the second capacitor are part of a capacitor pairing structure, and
   wherein the threshold voltage has an inverse proportional dependence on the product of the first resistor and the first capacitor and the clock frequency.

* * * * *